(12) United States Patent
Choi et al.

(10) Patent No.: US 7,833,846 B1
(45) Date of Patent: Nov. 16, 2010

(54) ARRAY SUBSTRATE AND METHOD OF FABRICATING THE SAME

(75) Inventors: Hee-Dong Choi, Gumi-si (KR); Seong-Moh Seo, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/591,360

(22) Filed: Nov. 17, 2009

(30) Foreign Application Priority Data

Jul. 24, 2009 (KR) .................. 10-2009-0067742

(51) Int. Cl.
 H01L 21/00 (2006.01)
 H01L 29/04 (2006.01)
 H01L 21/336 (2006.01)
 H01L 29/786 (2006.01)

(52) U.S. Cl. .................. 438/149; 438/150; 438/158; 257/72; 257/E21.414; 257/E29.294

(58) Field of Classification Search .................. 438/149, 438/150, 158; 257/72, E21.414, E29.294
See application file for complete search history.

(56) References Cited

U.S. PATENT DOCUMENTS

2008/0001529 A1* 1/2008 Park et al. .................. 313/504
2008/0012484 A1* 1/2008 Park et al. .................. 313/509
2008/0122349 A1* 5/2008 Kim et al. .................. 313/504
2010/0123138 A1* 5/2010 Choi et al. .................. 257/72

* cited by examiner

*Primary Examiner*—Luan C Thai
(74) *Attorney, Agent, or Firm*—McKenna Long & Aldridge LLP

(57) ABSTRACT

A method of fabricating an array substrate includes forming a buffer layer; forming a gate electrode on the buffer layer, a gate insulating layer on the gate electrode and an active layer on the gate insulating layer, the gate electrode including a bottom pattern, a middle pattern and a top pattern; forming an interlayer insulating layer, the first and second contact holes respectively exposing both sides of the active layer; forming first and second barrier patterns, first and second ohmic contact patterns, a source electrode, a drain, and a data line; forming a first passivation layer including a gate contact hole exposing the gate electrode; forming a gate line on the first passivation layer and contacting the gate electrode through the gate contact hole; forming a second passivation layer on the gate line; and forming a pixel electrode on the second passivation layer and contacting the drain electrode.

17 Claims, 12 Drawing Sheets dry-etching

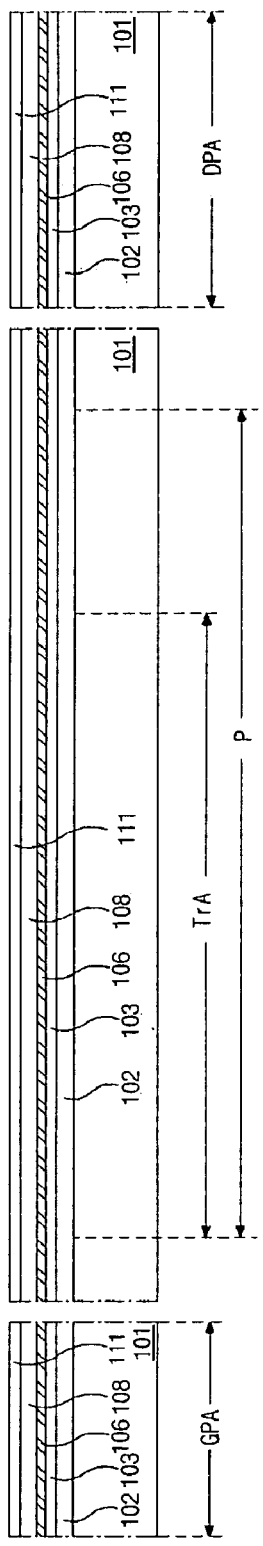
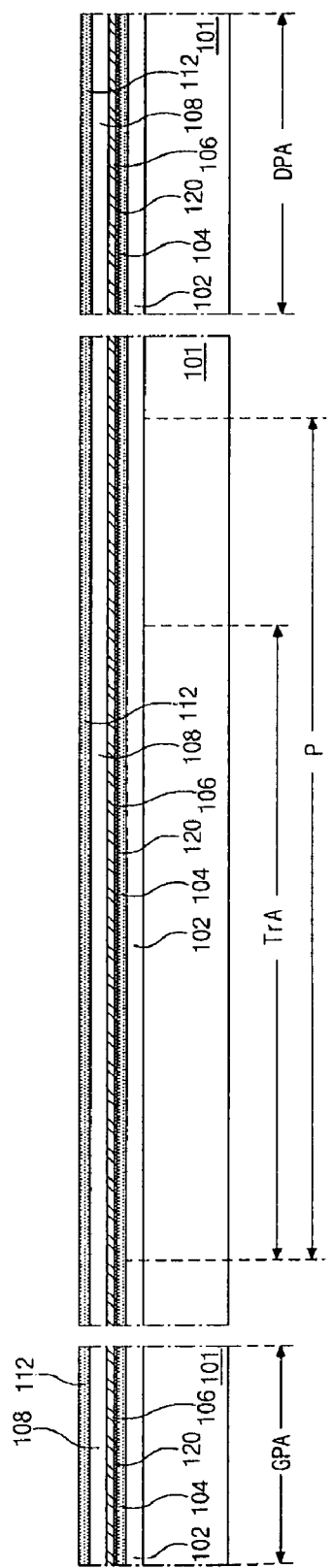

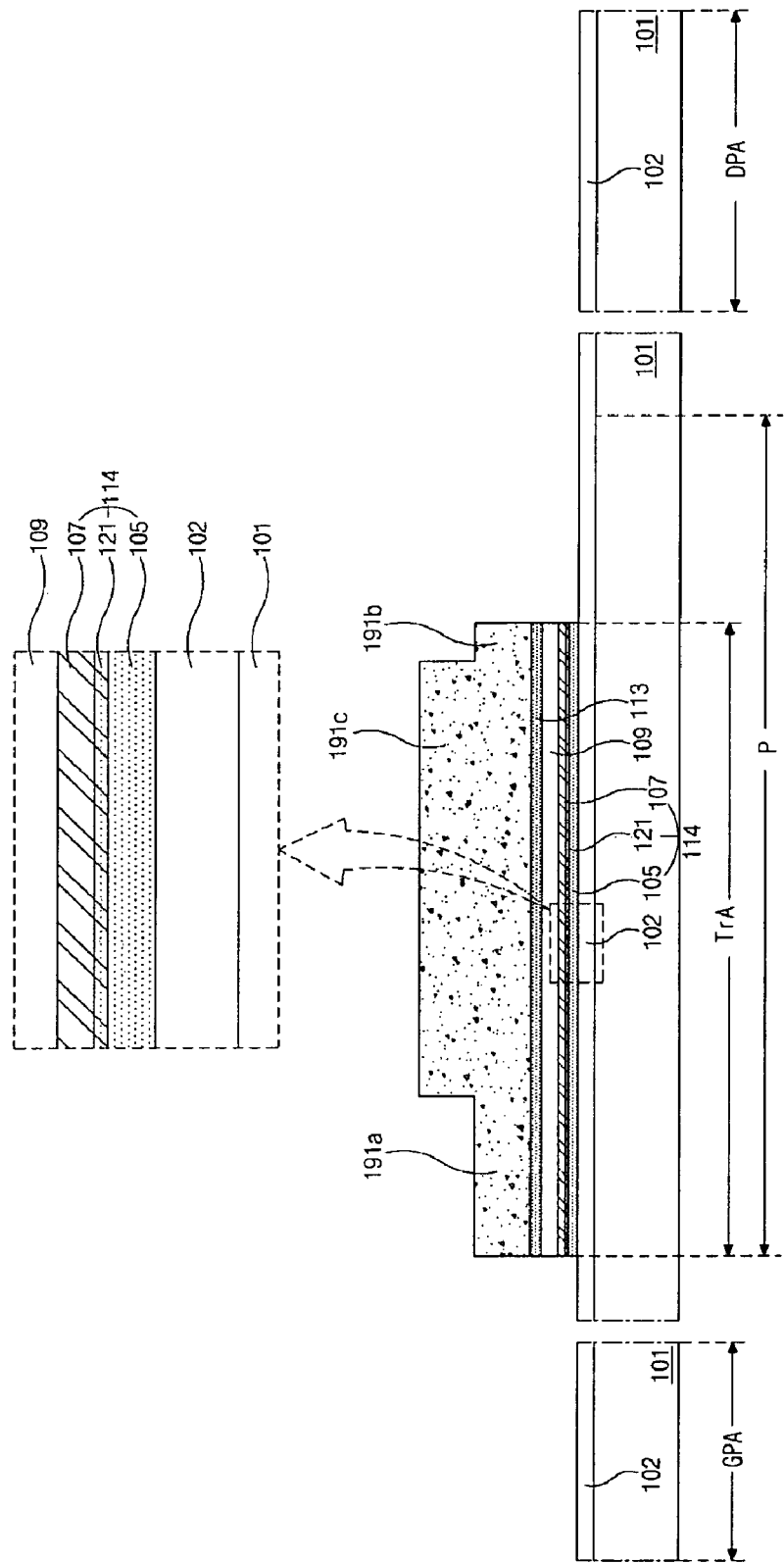

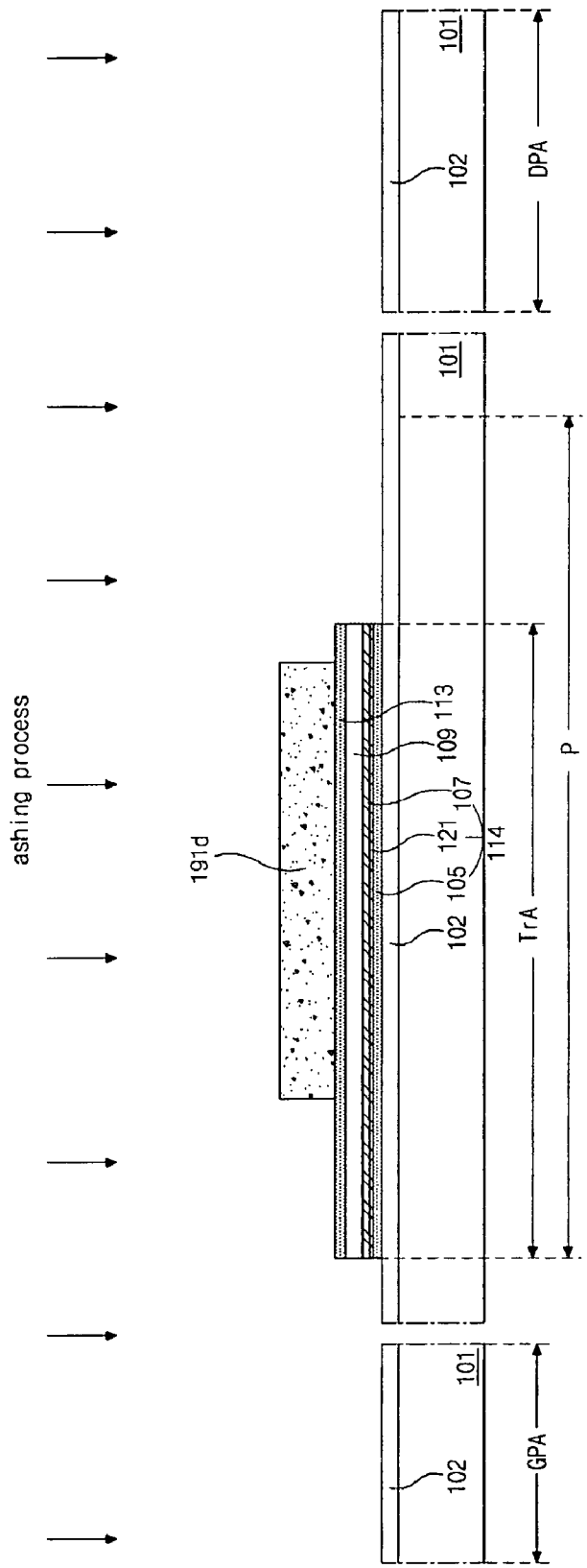

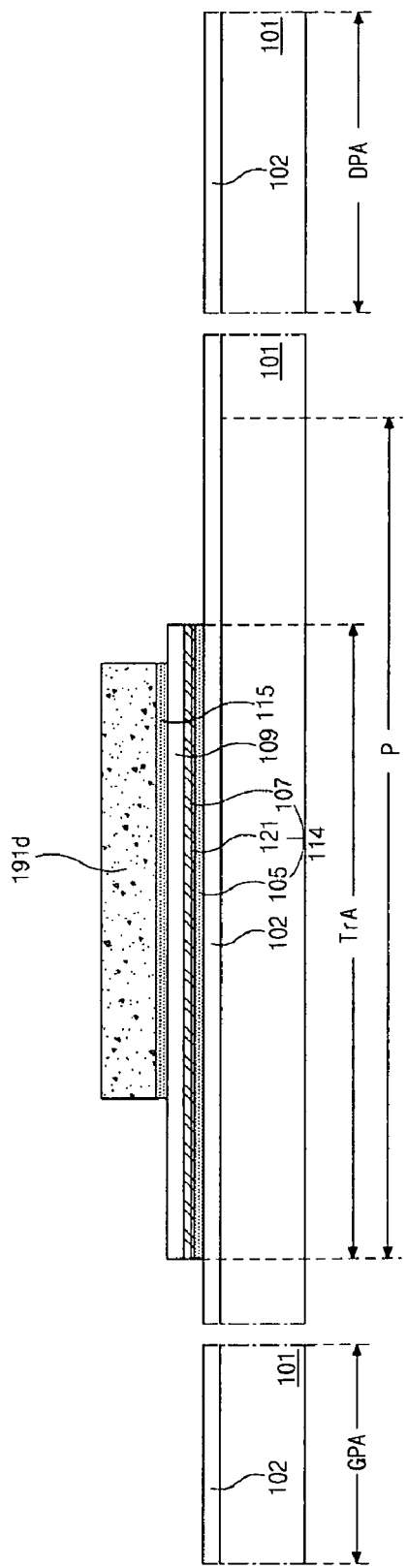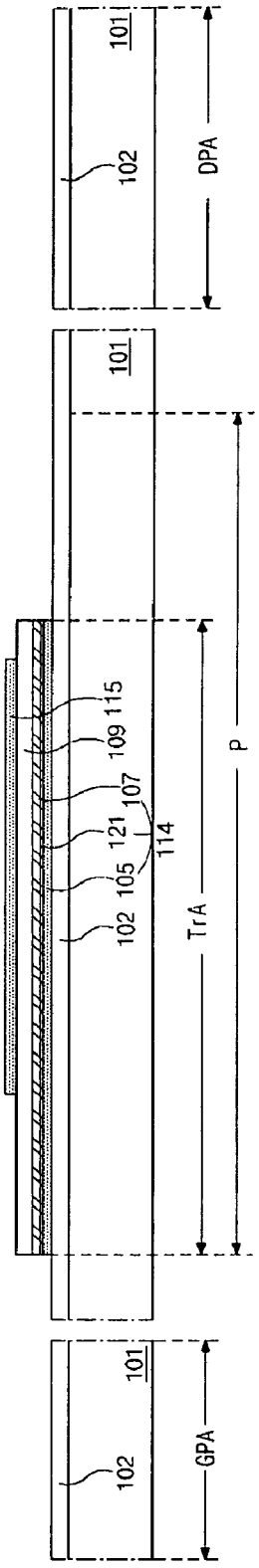

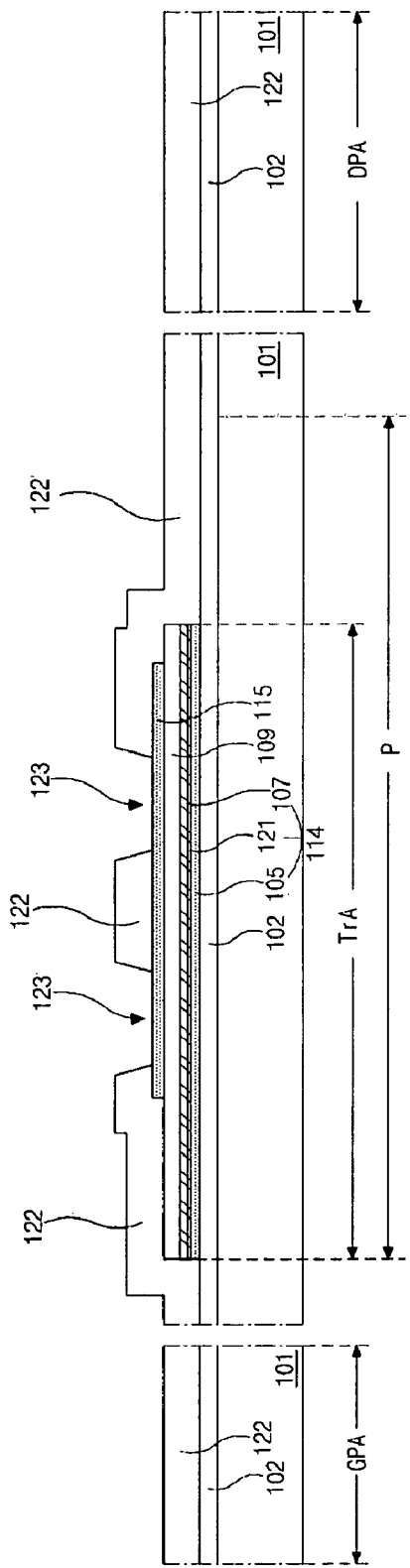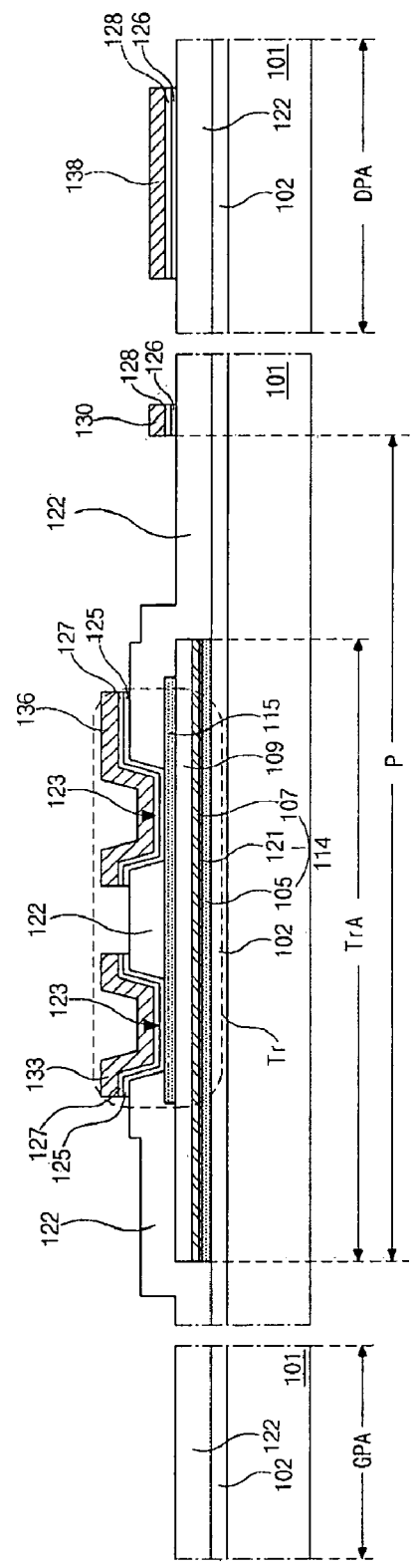

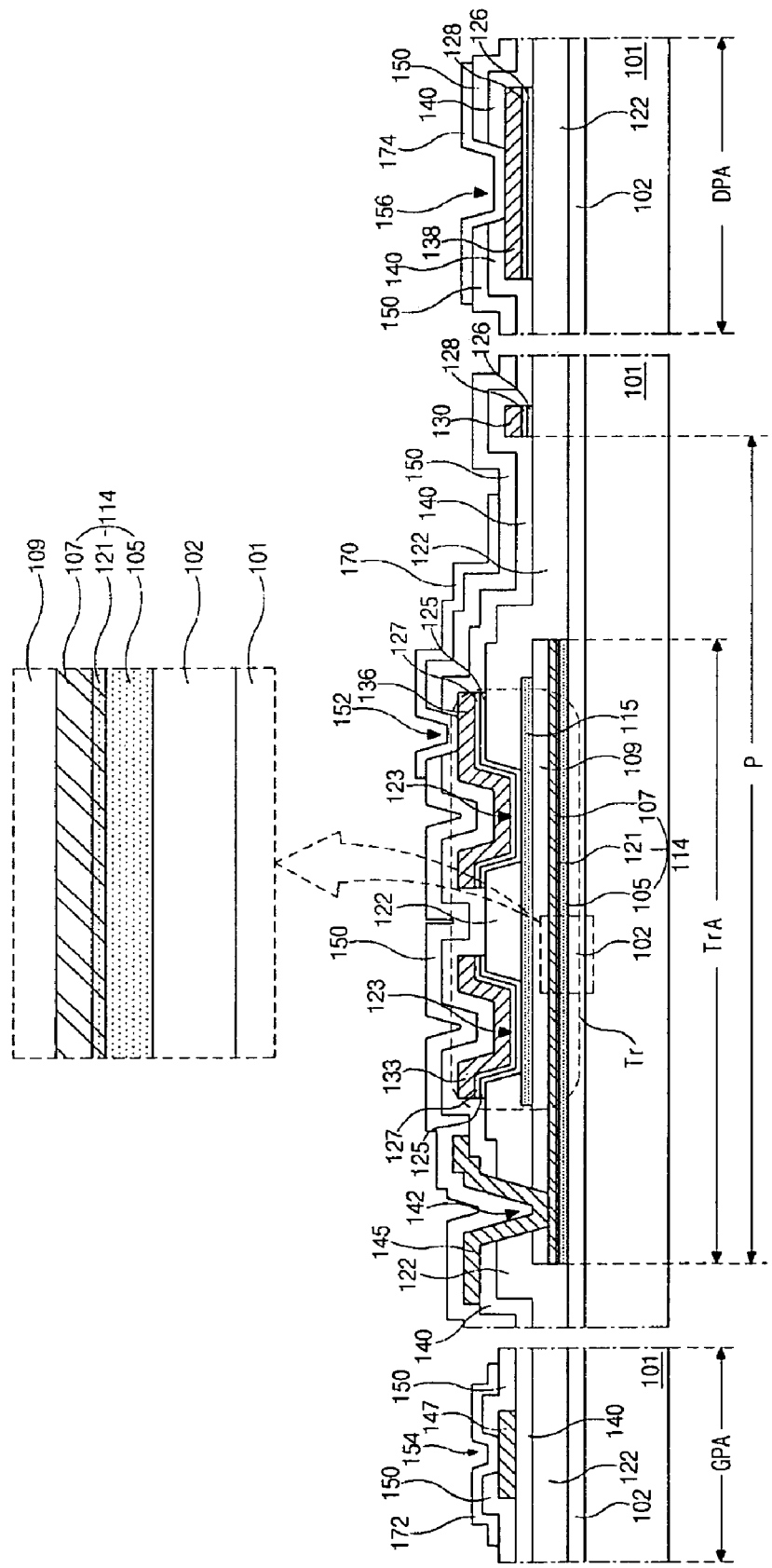

ARRAY SUBSTRATE AND METHOD OF FABRICATING THE SAME

The present application claims the benefit of Korean Patent Application No. 10-2009-0067742 filed in Korea on Jul. 24, 2009, which is hereby incorporated by reference.

BACKGROUND OF THE INVENTION

1. Field of the Invention

The present invention relates to an array substrate and more particularly to an array substrate being capable of preventing damages on an active layer and having an excellent property and a method of fabricating the array substrate.

2. Discussion of the Related Art

As the society has entered in earnest upon an information age, flat panel display devices, which have excellent capabilities of a thin profile, light weight and low power consumption, and so on, are introduced.

Among these devices, an active matrix type liquid crystal display (LCD) device is widely used for notebook computers, monitors, TV, and so on instead of a cathode ray tube (CRT), because of their high contrast ratio and characteristics adequate to display moving images.

On the other hand, an organic electroluminescent display (OELD) device is also widely used because their high brightness and low driving voltage. In addition, since the OELD device is a self-emission type, the OELD device produces high contrast ratio, a thin profile and a fast response time.

Both the LCD device and the OELD device require an array substrate where a thin film transistor (TFT) as a switching element in each pixel for controlling the pixel to be turned on and off.

FIG. 1 is a cross-sectional view showing one pixel region of the related art array substrate. In FIG. 1, a gate electrode 15 is formed on a substrate 11 and in a switching region TrA where a TFT Tr will be formed. A gate line (not shown) connected to the gate electrode 15 is formed along a first direction. A gate insulating layer 18 is formed on the gate electrode 15 and the gate line. A semiconductor layer 28 including an active layer 22 of intrinsic amorphous silicon and an ohmic contact layer 26 of impurity-doped amorphous silicon is formed on the gate insulating layer 18 and in the switching region TrA. A source electrode 36 and a drain electrode 38 are formed on the semiconductor layer 28 and in the switching region TrA. The source electrode 36 is spaced apart from the drain electrode 38. A data line 33 connected to the source electrode 36 is formed along a second direction. The data line 33 crosses the gate line to define a pixel region P. The gate electrode 15, the gate insulating layer 18, the semiconductor layer 28, the source electrode 36 and the drain electrode 38 constitute the TFT Tr.

A passivation layer 42 including a drain contact hole 45 is formed to cover the TFT Tr. On the passivation layer 42, a pixel electrode 50 connected to the drain electrode 38 through the drain contact hole 45 is formed. In FIG. 1, first and second patterns 27 and 23, which are respectively formed of the same material as the ohmic contact layer 26 and the active layer 22, are formed under the data line 33.

In the semiconductor layer 28 of the TFT Tr, the active layer 22 of intrinsic amorphous silicon has a difference in a thickness. Namely, the active layer 22 has a first thickness t1 at a central portion and a second thickness t2 at side portions. The first thickness t1 is different from the second thickness t2. Properties of the TFT Tr is degraded by the thickness difference in the active layer 22. The thickness difference in the active layer 22 results from a fabricating process explained with reference to FIGS. 2A to 2E.

FIGS. 2A to 2E are cross-sectional views illustrating a fabricating process of the related art array substrate. For convenience of explanation, the gate electrode and the gate insulating layer under the active layer is not shown.

In FIG. 2A, an intrinsic amorphous silicon layer 20, an impurity-doped amorphous silicon layer 24 and a metal layer 30 are sequentially formed on the substrate 11. Then, a photoresist (PR) layer (not shown) is formed on the metal layer 30 by coating a PR material. The PR layer is exposed using an exposing mask and developed to form a first PR pattern 91 having a third thickness and a second PR pattern 92 having a fourth thickness smaller than the third thickness. The first PR pattern 91 covers a portion of the metal layer 30 where the source and drain electrodes are formed, and the second PR pattern 92 covers a space between the source and drain electrodes. The first PR pattern 91 is positioned at both sides of the second PR pattern 92. Other portions of the metal layer 30 are exposed.

In FIG. 2B, the exposed metal layer 30 and the impurity-doped amorphous silicon layer 24 (of FIG. 2A) and the intrinsic amorphous silicon layer 20 (of FIG. 2A) under the exposed metal layer 30 are etched using the first and second PR patterns 91 and 92 as an etching mask. As a result, the active layer 22, an impurity-doped amorphous silicon pattern 25 and a source-drain pattern 31 are formed on the substrate 11.

In FIG. 2C, an ashing process is performed on the first and second PR patterns 91 and 92 (of FIG. 2B) such that the second PR pattern 92 having the fourth thickness is removed. The first PR pattern 91 is partially removed such that a third PR pattern 93, which has a smaller thickness than the first PR pattern 91, is formed on the source-drain pattern 31. A central portion of the source-drain pattern 31 is exposed by removing the second PR pattern 92.

In FIG. 2D, the exposed central portion of the source-drain pattern 31 (of FIG. 2C) is etched to form the source and drain electrodes 36 and 38 spaced apart from each other. As a result, a central portion of the impurity-doped amorphous silicon pattern 25 is exposed through the source and drain electrodes 36 and 38.

In FIG. 2E, a dry-etching process is performed onto the impurity-doped amorphous silicon pattern 25 (of FIG. 2D) to removed the impurity-doped amorphous silicon pattern 25. As a result, the ohmic contact layer 26 are formed under the source and drain electrodes 36 and 38.

In this case, the dry-etching process is performed for a relative long time to completely remove the impurity-doped amorphous silicon pattern 25 exposed through a space between the source and drain electrodes 36 and 38. As a result, a central portion of the active layer 22 under the removed impurity-doped amorphous silicon pattern 25 is partially removed by the dry-etching process such that the active layer 22 has a difference in a thickness. (t1≠t2) If the dry-etching process is not performed for an enough long time, the impurity-doped amorphous silicon pattern 25 partially remains on the active layer 22 such that properties of the TFT Tr (of FIG. 1) are seriously degraded. The thickness difference in the active layer 22 is an inevitable result of the above fabricating process for the array substrate.

In addition, since the active layer 22 is partially removed during the dry-etching process, the intrinsic amorphous silicon layer 20 for the active layer 22 should be formed to have an enough thickness above 1000 angstroms such that there are disadvantages in production costs and a fabricating time.

The TFT Tr is very important element for the array substrate. The TFT Tr is positioned in each pixel region and connected to the gate and data line such that a signal is selectively provided the pixel electrode in each pixel region through the TFT Tr. Unfortunately, since the active layer of the TFT Tr is formed of intrinsic amorphous silicon, there are some problems. For example, when light is irradiated onto the active layer or an electric field is applied to the active layer, the active layer is changed to be a metastable state such that there is a problem of a security of the TFT Tr. In addition, since mobility of carriers in a channel of the active layer is relatively low, the TFT Tr including the active layer of intrinsic amorphous silicon is not adequate to a driving element for the OELD device.

To resolve these problems, the TFT including an active layer of polycrystalline silicon, which is crystallized from intrinsic amorphous silicon by a crystallization process using a laser beam, is introduced. However, referring to FIG. 3, which is a cross-sectional view showing a TFT Tr including a semiconductor layer 55 of polycrystalline silicon for the related art array substrate, the semiconductor layer 55 includes a first region 55a and a second region 55b at both sides of the first region 55a. High concentration impurities should be doped into the second region 55b of the semiconductor layer 55. Accordingly, a doping process for the second region 55b and an implant apparatus for the doping process are required such that production costs are seriously increased. In addition, new process line is required.

SUMMARY OF THE INVENTION

Accordingly, the present invention is directed to an array substrate and a fabricating the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a. method of fabricating an array substrate includes forming a buffer layer of inorganic insulating material on a substrate including a pixel region; forming a gate electrode on the buffer layer, a gate insulating layer on the gate electrode and an active layer on the gate insulating layer, the gate electrode including a bottom pattern of impurity-doped polycrystalline silicon, a middle pattern of silicide and a top pattern of a first metallic material and positioned in a switching region in the pixel region; forming an interlayer insulating layer on the active layer and including first and second contact holes, the first and second contact holes respectively exposing both sides of the active layer; forming first and second barrier patterns respectively contacting the both sides of the active layers through the first and second contact holes, first and second ohmic contact patterns respectively on the first and second barrier patterns, a source electrode on the first ohmic contact pattern, a drain electrode on the second ohmic contact pattern, and a data line connecting the source electrode; forming a first passivation layer on the source electrode, the drain electrode and the data line and including a gate contact hole exposing the gate electrode; forming a gate line on the first passivation layer and contacting the gate electrode through the gate contact hole, the gate line crossing the data line to define the pixel region; forming a second passivation layer on the gate line and including a drain contact hole exposing the drain electrode; and forming a pixel electrode on the second passivation layer and contacting the drain electrode through the drain contact hole.

In another aspect, an array substrate includes a buffer layer of an inorganic insulating layer on a substrate including a pixel region; a gate electrode on the buffer layer and in a switching region in the pixel region, the gate electrode including a bottom pattern of impurity-doped polycrystalline silicon, a middle pattern of silicide and a top pattern of a metallic material; a gate insulating layer on the gate electrode; an active layer on the gate insulating layer and exposing sides of the gate insulating layer, the active layer formed of intrinsic polycrystalline silicon; an interlayer insulating layer on the active layer and including first and second contact holes, the first and second contact holes respectively exposing both sides of the active layer; first and second barrier patterns respectively contacting the both sides of the active layers through the first and second contact holes; first and second ohmic contact patterns respectively on the first and second barrier patterns; a source electrode on the first ohmic contact pattern; a drain electrode on the second ohmic contact pattern; a data line connecting the source electrode on the interlayer insulating layer; a first passivation layer on the source electrode, the drain electrode and the data line and including a gate contact hole exposing the gate electrode; a gate line on the first passivation layer and contacting the gate electrode through the gate contact hole, the gate line crossing the data line to define the pixel region; a second passivation layer on the gate line and including a drain contact hole exposing the drain electrode; and a pixel electrode on the second passivation layer and contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 4A to 4M are cross-sectional views showing a fabricating process of an array substrate according to the present invention.

DETAILED DESCRIPTION OF THE EMBODIMENTS

Figure 1:
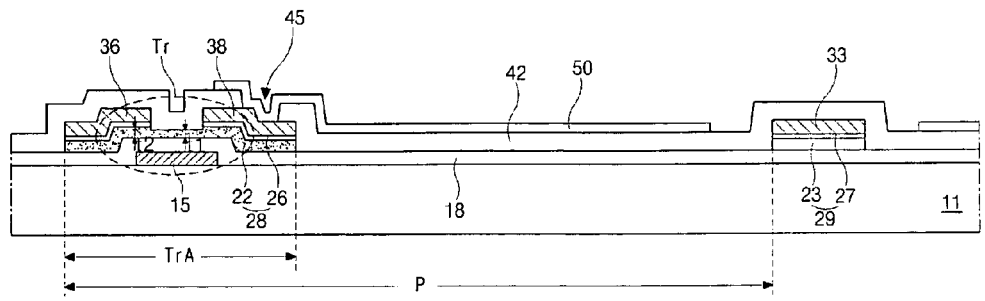
FIG. 1 is a cross-sectional view showing one pixel region of the related art array substrate.
Figure 2A:
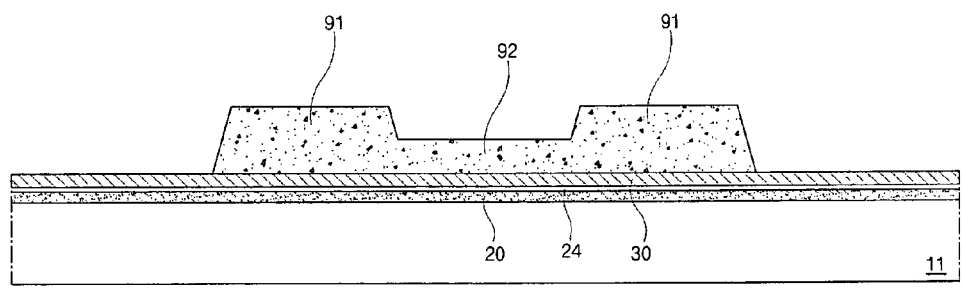
FIGS. 2A to 2E are cross-sectional views illustrating a fabricating process of the related art array substrate.
Figure 2B:
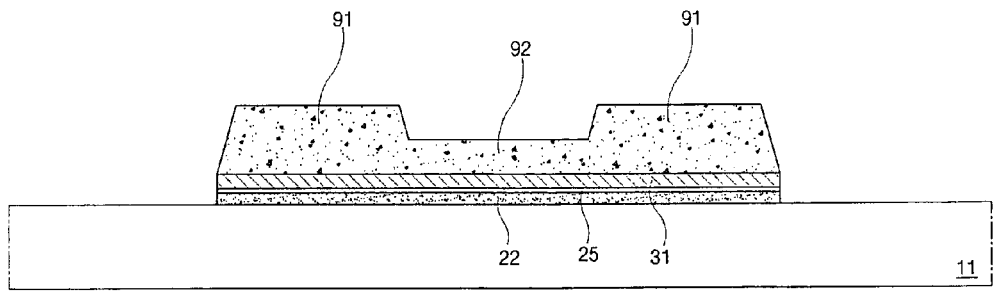
Figure 2C:
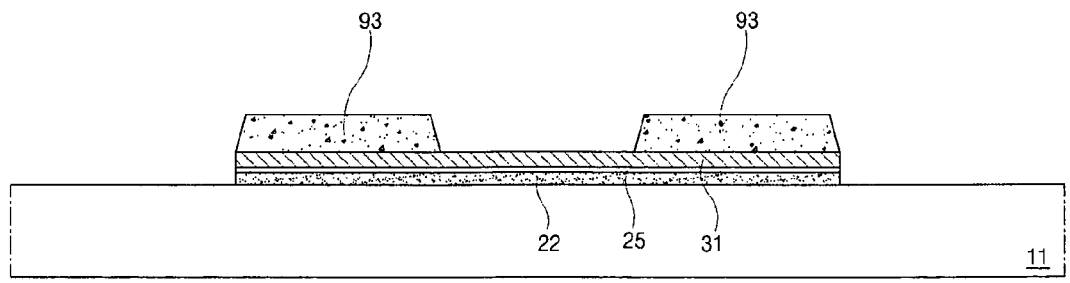
Figure 2D:
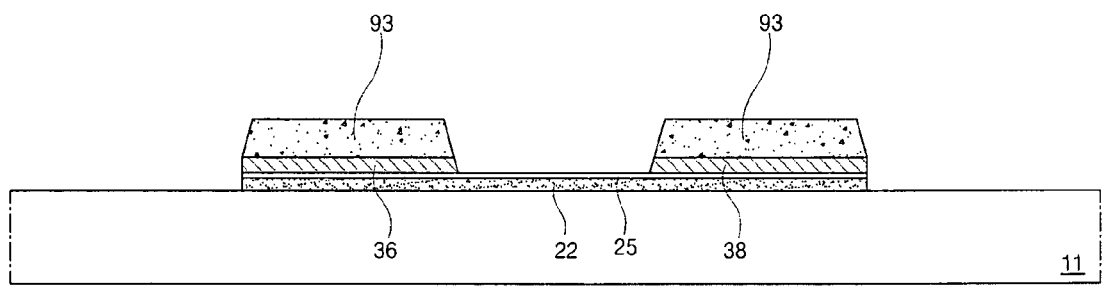
Figure 2E:
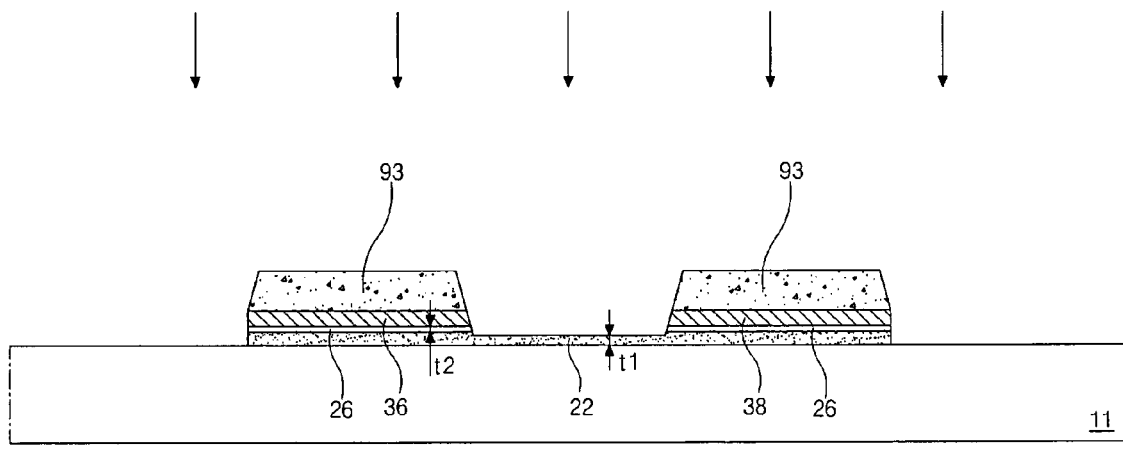
Figure 3:
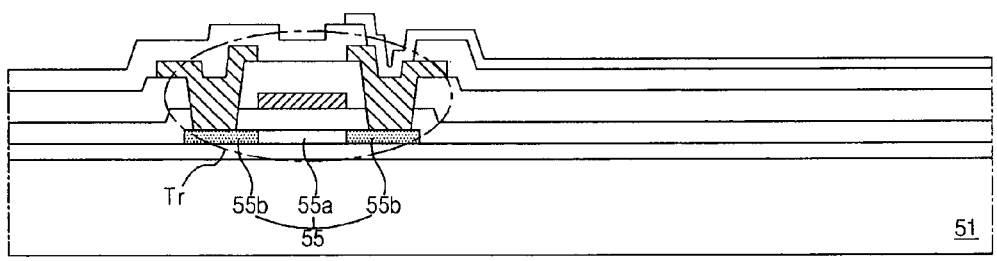
FIG. 3, which is a cross-sectional view showing a TFT including a semiconductor layer of polycrystalline silicon for the related art array substrate.

Reference will now be made in detail to the preferred embodiments, examples of which are illustrated in the accompanying drawings.

FIGS. 4A to 4M are cross-sectional views showing a fabricating process of an array substrate according to the present invention. A switching region, where a TFT will be formed, is defined in a pixel region. A gate pad region, where a gate pad electrode and an auxiliary gate pad electrode will be formed, and a data pad region, where a data pad electrode and an auxiliary data pad electrode will be formed, are defined.

First, as shown in FIG. 4A, a buffer layer 102 is formed on a substrate 101 by depositing an inorganic insulating material, for example, silicon oxide or silicon nitride. For example, the substrate 101 may be a transparent glass substrate. A solid phase crystallization (SPC) process is required in the present invention for crystallizing an amorphous silicon into a polycrystalline silicon layer. The SPC process is performed under a temperature of about 600 to 800° C. When the substrate 101 is exposed to the process temperature of the SPC process without the buffer layer 102, an alkali ion is diffused from the substrate 101 to the polycrystalline silicon layer such that properties of the polycrystalline silicon layer is degraded. To prevent this problem, the buffer layer 102 is required. The buffer layer 102 has a thickness of about 1000 to 3000 angstroms.

Next, a first impurity-doped amorphous silicon layer 103 is formed on the buffer layer 102 by depositing impurity-doped amorphous silicon. The first impurity-doped amorphous silicon layer 103 has a thickness of about 500 to 1000 angstroms. A first metal layer 106 is formed on the first impurity-doped amorphous silicon layer 103 by depositing a first metallic material. The first metallic material is capable of forming a silicide layer with a silicon layer at their interface when exposed under the SPC process temperature to decrease a contact resistance. For example, the first metallic material may include molybdenum (Mo) or titanium (Ti). The first metal layer 106 has a thickness below about 1000 angstroms. It is preferable to have a thickness of about 100 to 500 angstroms to prevent for the substrate 101 from being bent by the SPC process. In the experiment, when the first metal layer 106 has a thickness above about 1000 angstroms, the substrate 101 has a non-flat surface after the SPC process because of expansion and contraction of the first metal layer 106. A mis-aligning problem is generated on the substrate 101 having the non-flat surface. To prevent this problem, the first metal layer 106 has a thickness of about 100 to 500 angstroms.

A first inorganic insulating layer 108 is formed on the first metal layer 106 by depositing an inorganic insulating material, for example, silicon oxide or silicon nitride. The first inorganic insulating layer 108 has a thickness of about 500 to 4000 angstroms. An intrinsic amorphous silicon layer 111 is formed on the first inorganic insulating layer 108 by depositing intrinsic amorphous silicon. The intrinsic amorphous silicon layer 111 has a thickness of about 300 to 1000 angstroms. In the related art array substrate, the active layer of intrinsic amorphous silicon should have a thickness above 1000 angstroms because the active layer is partially removed by the dry-etching process for the ohmic contact layer. However, since the intrinsic amorphous silicon layer 111 is not exposed to a dry-etching process, the intrinsic amorphous silicon layer 111 has a thickness being capable of serving as an active layer. Namely, the intrinsic amorphous silicon layer 111 has a relatively low thickness of about 300 to 1000 angstroms such that production costs and a fabricating time are reduced.

Next, as shown in FIG. 4B, to improve a mobility property of the intrinsic amorphous silicon layer 111 (of FIG. 4A), the SPC process is performed. The intrinsic amorphous silicon layer 111 is crystallized by the SPC process to form an intrinsic polycrystalline silicon layer 112. For example, the SPC process is a thermal crystallization process or an alternating magnetic field crystallization process. In the thermal crystallization process, the intrinsic amorphous silicon layer 111 is heated under a temperature of about 600 to 800° C. In the alternating magnetic field crystallization process, the intrinsic amorphous silicon layer 111 is crystallized using alternating magnetic field crystallization apparatus under a temperature of about 600 to 700° C.

By the SPC process, not only the intrinsic amorphous silicon layer 111 but also the first impurity-doped amorphous silicon layer 103 (of FIG. 4A) is crystallized to form an impurity-doped polycrystalline silicon layer 104.

During the SPC process, the substrate 101, the buffer layer 102, the first impurity-doped amorphous silicon layer 103, the first inorganic insulating layer 108, the impurity-doped amorphous silicon layer 111 and the first metal layer 106 are thermally expanded and thermally contracted. Since a main compound of the substrate 101, the buffer layer 102, the first impurity-doped amorphous silicon layer 103, the first inorganic insulating layer 108 and the impurity-doped amorphous silicon layer 111 is silicon, a degree of their thermal expansion and contraction is substantially equal. Accordingly, there is no deformation problem even if their thickness is changed. However, since the first metal layer 106 of Mo or Ti has a different thermal expansion and contraction from the substrate 101, there is a deformation problem in the substrate 101 during the SPC process if the first metal layer 106 has a relatively large thickness. As mentioned above, if the first metal layer 106 has a thickness above 1000 angstroms, there is a deformation problem in the substrate 101 during the SPC process. In the present invention, to prevent this problem, the first metal layer 106 has a relatively small thickness. The first metal layer 106 has a thickness below 500 angstroms.

On the other hand, a silicide layer 120 is formed between the impurity-doped polycrystalline silicon layer 104 and the first metal layer 106. During the SPC process, the first metallic material of the first metal layer 106 and the impurity-doped amorphous silicon of the first impurity-doped amorphous silicon layer 103 are diffused and mixed at their interface such that the silicide layer 120 of moly-silicide or titanium-silicide is formed between the impurity-doped polycrystalline silicon layer 104 and the first metal layer 106. The silicide layer 120 has a thickness of about 10 to 50 angstroms. A contact resistance between the impurity-doped polycrystalline silicon layer 104 and the first metal layer 106 is reduced due to the silicide layer 120 such that a conductive property of the impurity-doped polycrystalline silicon layer 104 is improved.

Figure 4C:
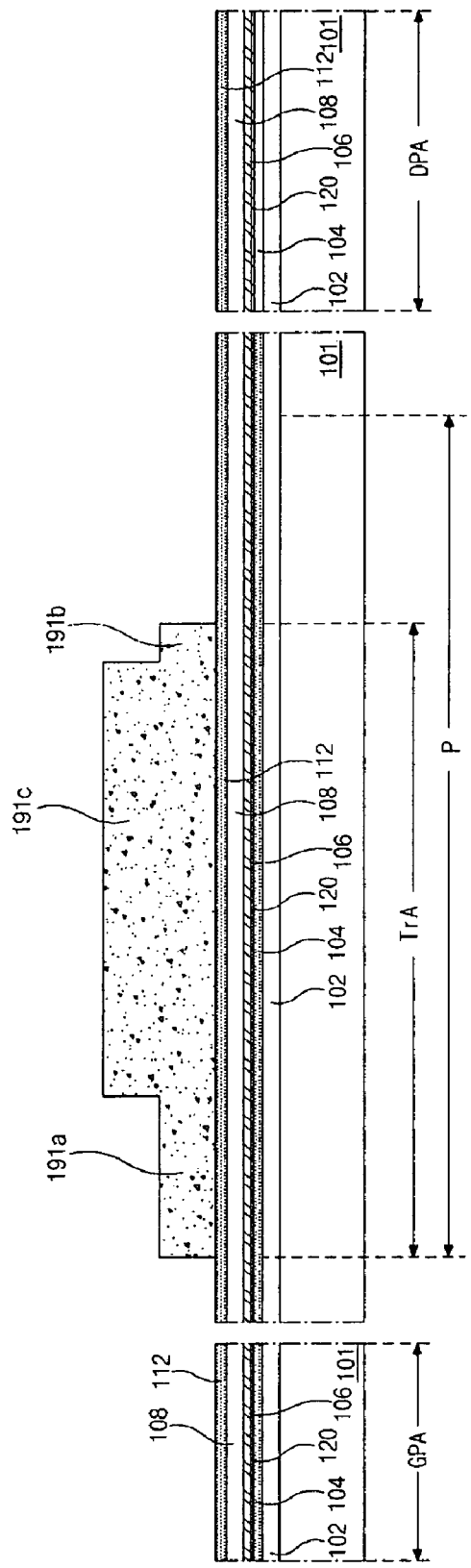

Next, as shown in FIG. 4C, a photoresist (PR) layer (not shown) is formed on the intrinsic amorphous silicon layer 112 by coating a PR material. An exposing mask (not shown) including a transmissive portion, a blocking portion and a half-transmissive portion is disposed over the PR layer. The half-transmissive portion has light transmittance smaller than the transmissive portion and larger than the blocking portion. The half-transmissive portion is formed of a slit or multiple coating layers. The exposing mask may be referred to as a half-tone mask. The PR layer is exposed through the exposing mask and developed to form first and second PR patterns 191a and 191b having a first thickness and a third PR pattern 191c having a second thickness larger than the first thickness. The first to third PR patterns 191a to 191c correspond to a gate electrode 114 (of FIG. 4M). The third PR pattern 191c corresponds to a center of the gate electrode 114 and the active layer 115 (of FIG. 4M), and the first and second PR pattern 191a and 191b respectively correspond to both sides of the gate electrode 114. Namely, the third PR pattern 191c is positioned between the first and second PR patterns 191a and 191b. The intrinsic polycrystalline silicon layer 112 in the switching region TrA is covered with first to third PR patterns 191*a* to 191*c*, and the intrinsic polycrystalline silicon layer 112 in other regions is exposed.

The first and second PR patterns 191*a* and 191*b* have different widths such that edges of the gate electrode 114 (of FIG. 4M), a gate insulating layer 109 (of FIG. 4M) and the active layer 115 (of FIG. 4M) has a stair shape. As a result, it is prevented for an interlayer insulating layer 122 (of FIG. 4M) from being gotten loose. In addition, a width of the first PR pattern 191*a* is larger than that of the second PR pattern 191*b* to provide an area for contacting the gate electrode 114 (of FIG. 4M) with a gate line 145 (of FIG. 4M). Since the gate electrode 114 and the gate line 145 are formed of different layers, a contact hole for contacting the gate line 145 to the gate electrode 114 is required.

Next, as shown in FIG. 4D, the exposed intrinsic polycrystalline silicon layer 112 (of FIG. 4C) and the first inorganic insulating layer 108 (of FIG. 4C), the first metal layer 106 (of FIG. 4C), the silicide layer 120 (of FIG. 4C) and the first impurity-doped polycrystalline silicon layer 104 (of FIG. 4C) under the exposed intrinsic polycrystalline silicon layer 112 are sequentially etched to form the gate electrode 114 on the buffer layer 102, a gate insulating layer 109 on the gate electrode 114 and an intrinsic polycrystalline silicon pattern 113 on the gate insulating layer 109. The gate electrode 114, the gate insulating layer 109 and the intrinsic polycrystalline silicon pattern 113 are positioned in the switching region TrA. The gate electrode 114 includes a triple layers of the first impurity-doped polycrystalline silicon layer 104 (of FIG. 4C), the silicide layer 120 (of FIG. 4C) and the first metal layer 106 (of FIG. 4C) and has an island shape.

In the present invention, the gate electrode 114 is formed of impurity-doped polycrystalline silicon to resolve below problem. In a fabricating process of the bottom gate type TFT, the gate line and the gate electrode are formed on the substrate by depositing and patterning a metallic material having a low resistant property, and the semiconductor layer of amorphous silicon is formed over the gate electrode with the gate insulating layer therebetween. To crystallize the semiconductor layer, the SPC process is performed under a relatively high temperature, for example, above 600° C. During the SPC process, the gate electrode and the gate line of the metallic material are deformed. Or, the gate electrode protrudes through the gate insulating layer because of a thermal effect during the SPC process such that the gate electrode contacts the intrinsic polycrystalline silicon layer. It may be referred to as a spike problem. However, since the gate electrode 114 is formed of impurity-doped polycrystalline silicon in the present invention, there is no problem.

The gate electrode 114 includes a bottom pattern 105 of impurity-doped polycrystalline silicon, a middle pattern 121 of silicide and a top pattern 107 of the first metallic material. Although the gate electrode 114 includes the first metallic material, there is no spike problem in the gate electrode 104 with the active layer 115 (of FIG. 4M) because the top pattern 107 of the first metallic material is too thin. In addition, since the SPC process is performed onto the first metallic layer 106 (of FIG. 4C) formed on an entire surface of the substrate 101, a deformation problem is not generated.

The gate electrode including the impurity-doped polycrystalline silicon has a conductivity lower than the related art gate electrode including a metallic material. However, when a thickness of the impurity-doped polycrystalline silicon layer has a range within 500 to 1000 angstroms, the impurity-doped polycrystalline silicon layer has a resistance substantially similar to a transparent conductive material, such as indium-tin-oxide (ITO) and indium-zinc-oxide (IZO). The impurity-doped polycrystalline silicon layer having a thickness of 500 to 1000 angstroms has a resistance of 150 to 230 ohm per unit area. Accordingly, when the impurity-doped polycrystalline silicon layer is used for the gate electrode, there is no problem. In addition, since the gate electrode 114 includes the middle pattern 121 of silicide and the top pattern 107 of the first metallic material as well as the bottom pattern 105 of impurity-doped polycrystalline silicon, the gate electrode 114 has an improved conductivity. The gate electrode 114 including the bottom pattern 105 of impurity-doped polycrystalline silicon, the middle pattern 121 of silicide and the top pattern 107 of the first metallic material has a resistance below 150 ohm per unit area.

Next, as shown in FIG. 4E, an ashing process is performed on to the first to third PR patterns 191*a* to 191*c* (of FIG. 4D) to remove the first and second PR patterns 191*a* and 191*b* and form a fourth PR pattern 191*d* from the third PR pattern 191*c*. As a result, both sides of the intrinsic polycrystalline silicon layer 113 are exposed by removing the first and second PR patterns 191*a* and 191*b*. As mentioned above, since the first PR pattern 191*a* has a width larger than the second PR pattern 191*b*, the left-side exposed portion of the intrinsic polycrystalline silicon layer 113 has an area larger than the right-side exposed portion of the intrinsic polycrystalline silicon layer 113.

Next, as shown in FIG. 4F, the exposed intrinsic polycrystalline silicon layer 113 (of FIG. 4E) is etched to expose edges of the gate insulating layer 109 and form an active layer 115 from the intrinsic polycrystalline silicon layer 115 under the fourth PR pattern 191*d*. The active layer 113 leans to the right side with respect to a center of the gate electrode 114.

Next, as shown in FIG. 4G, a stripping process is performed onto the fourth PR pattern 191*d* (of FIG. 4F) to remove the fourth PR pattern 191*d* and expose the active layer 115.

Next, as shown in FIG. 4H, a second inorganic insulating layer (not shown) is formed on the active layer 115 by depositing one or both of silicon oxide and silicon nitride. Namely, the second inorganic insulating layer has a single-layered structure or a double-layered structure. The second inorganic insulating layer has a thickness equal to or larger than a thickness summation of the gate electrode 114 and the gate insulating layer 109. If the thickness of the second inorganic insulating layer is smaller than the thickness summation of the gate electrode 114 and the gate insulating layer 109, the second inorganic insulating layer may have a discontinuous portion at an end portion of the gate electrode 114 and the gate insulating layer 109. A thickness of the gate electrode 114 has a range within about 600 to 1500 angstroms, and a thickness of the gate insulating layer 109 has a range within about 500 to 4000 angstroms. Accordingly, the second inorganic insulating layer has a thickness equal to or larger than a thickness of about 1100 to 5500 angstroms. For example, when the thickness of the gate electrode 114 is about 1000 angstroms and the thickness of the gate insulating layer 109 is about 2000 angstroms, the thickness of the first inorganic insulating layer is at least about 3000 angstroms.

The second inorganic insulating layer is patterned by a mask process, which includes a step of forming a PR layer, a step of exposing the PR layer using an exposing mask, a step of developing the PR layer to form a PR pattern, a step of etching the second inorganic insulating layer using the PR pattern as an etching mask, and a step of stripping the PR pattern, to form an interlayer insulating layer 122 including two contact holes 123. Both side portions of the active layer 115 are exposed by the contact holes 123. A center portion of the active layer 155 is covered with a portion of the interlayer insulating layer 122 between the contact holes 123. The interlayer insulating layer 122 covering the center portion of the active layer 155 serves as an etch-stopper.

Next, as shown in FIG. 4I, a barrier layer (not shown) having a thickness of about 50 to 300 angstroms is formed on the interlayer insulating layer 122 by depositing intrinsic amorphous silicon. Sequentially, a second impurity-doped amorphous silicon layer (not shown) and a second metal layer (not shown) are formed on the barrier layer by respectively depositing impurity-doped amorphous silicon and a second metallic material. The second impurity-doped amorphous silicon layer has a thickness of about 100 to 300 angstroms. A contact strength between intrinsic amorphous silicon and intrinsic polycrystalline silicon is larger than that between impurity-doped amorphous silicon and intrinsic polycrystalline silicon. Accordingly, the barrier layer of intrinsic amorphous silicon is positioned between the active layer 115 and the second impurity-doped amorphous silicon layer to improve a contact strength between the active layer 115 of intrinsic polycrystalline silicon and the second impurity-doped amorphous silicon layer. In addition, a contact resistance between the active layer 115 of intrinsic polycrystalline silicon and the second impurity-doped amorphous silicon layer is reduced due to the barrier layer of intrinsic amorphous silicon. The second metal layer is stacked on the second impurity-doped amorphous silicon layer and formed of one of molybdenum (Mo), chromium (Cr) and molybdenum-titanium alloy (MoTi).

Although not shown, before forming the barrier layer on the interlayer insulating layer 122, a cleaning process using a buffered oxide etchant (BOE) may be performed. It may be called as an BOE cleaning process. The intrinsic amorphous silicon layer 111 (of FIG. 4a) is directly exposed to the SPC process under a high temperature of 600 to 800° C. to form the active layer 115. As a result, a thermal oxidation layer (not shown) is formed on a top surface of the active layer 115. An ohmic contact property between the active layer 115 and the barrier layer is degraded by the thermal oxidation layer. Accordingly, the BOE cleaning process can be performed onto the active layer 115 to remove the thermal oxidation layer before the step of forming the barrier layer.

The second metal layer, the second impurity-doped amorphous silicon layer and the barrier layer are patterned by a mask process to form a data line 130 at a boundary of the pixel region P and a data pad electrode 138 in the data pad region DPA. The data pad electrode 138 is connected to an end of the data line 130. At the same time, barrier patterns 125, ohmic contact patterns 127, a source electrode 133 and a drain electrode 136 are formed in the switching region TrA. One of the barrier patterns 125 contacts the exposed active layer 115 through one of the contact hole 123 of the interlayer insulating layer 122, and one of the ohmic contact patterns 127 and the source electrode 133 are stacked on the one of the barrier patterns 125. The other one of the barrier patterns 125 contacts the exposed active layer 115 through the other one of the contact hole 123 of the interlayer insulating layer 122, and the other one of the ohmic contact patterns 127 and the drain electrode 136 are stacked on the other one of the barrier patterns 125. Namely, the one of the barrier patterns 125, the one of the ohmic contact patterns 127 and the source electrode 133 are spaced apart from the other one of the barrier patterns 125, the other one of the ohmic contact patterns 127 and the drain electrode 136, respectively. Since the one of the barrier patterns 125, the one of the ohmic contact patterns 127 and the source electrode 133 are patterned by a single mask process, they have substantially the same plane area and the same plane shape as one another to perfectly overlap one another. Similarly, the other one of the barrier patterns 125, the other one of the ohmic contact patterns 127 and the drain electrode 136 have substantially the same plane area and the same plane shape as one another. The source electrode 133 is connected to the data line 130. In addition, a first dummy pattern 128 at the same layer as the ohmic contact layers 127 and a second dummy pattern 126 at the same layer as the barrier patterns 125 are formed between the interlayer insulating layer 122 and the data line 130 and between the interlayer insulating layer 122 and the data pad electrode 138.

In the present invention, since a portion of the interlayer insulating layer 122 as the etch-stopper covers the center portion of the active layer 155, there is no damage on the active layer 115 during an dry-etching process for the ohmic contact layers 127 and the barrier patterns 125. Namely, since the interlayer insulating layer 122 covers the center portion of the active layer 115 during the dry-etching process for the ohmic contact layers 127 and the barrier patterns 125, the interlayer insulating layer 122 protects the active layer 115 such that a thickness of the active layer 115 is not reduced by the dry-etching process. Accordingly, the active layer 115 has an uniform thickness.

The gate electrode 114, which includes the bottom pattern 105 of impurity polycrystalline silicon, the middle pattern 121 of silicide and the top pattern 107 of the first metallic material, the gate insulating layer 109, the active layer 115 of intrinsic polycrystalline silicon, the interlayer insulating layer 122, the barrier patterns 125 of intrinsic amorphous silicon, the ohmic contact layers 127 of impurity-doped amorphous silicon and the source and drain electrodes 133 and 136 constitute the TFT Tr.

Although not shown, when the array substrate is used for the OELD device, a power line is formed at the same layer as the data line 130 to be parallel to the data line 130. In addition, a driving TFT having substantially the same structure as the above TFT Tr as a switching TFT and being connected to the above TFT Tr and the power line is further formed.

Figure 4J:
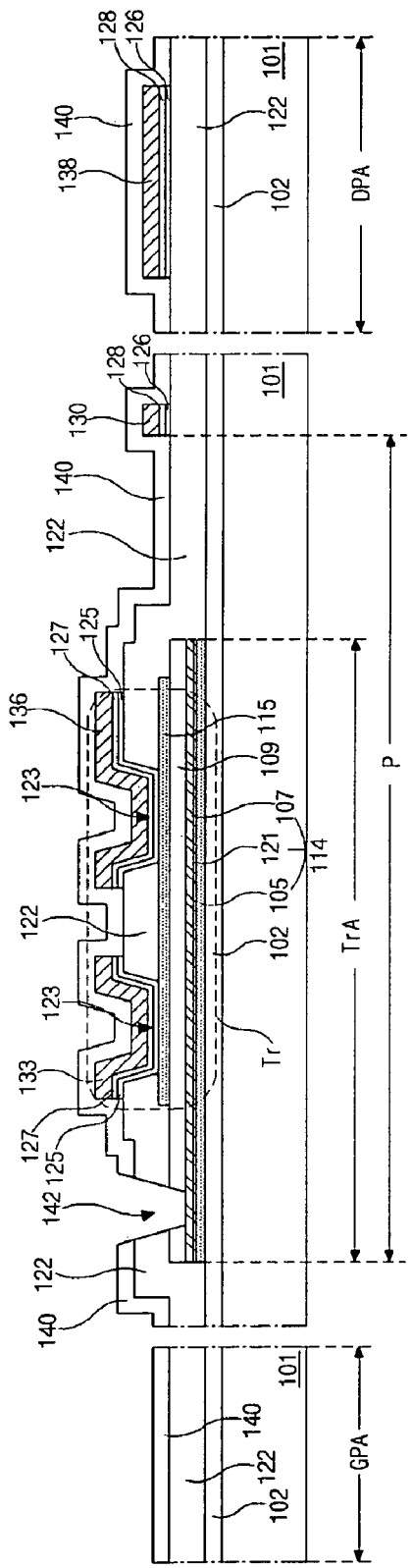

Next, as shown in FIG. 4J, a first passivation layer 140 is formed on the data line 130, the data pad electrode 138, the source electrode 133 and the drain electrode 136 by depositing an inorganic insulating material, for example, silicon oxide or silicon nitride. The first passivation layer 140, the interlayer insulating layer 122 and the gate insulating layer 109 are patterned by a mask process to form a gate contact hole 142 exposing one side of the gate electrode 114. The gate contact hole 142 is positioned at the left side of the active layer 115. As mentioned above, to secure an area for the gate contact hole 142, the active layer 115 leans the right side.

Figure 4K:
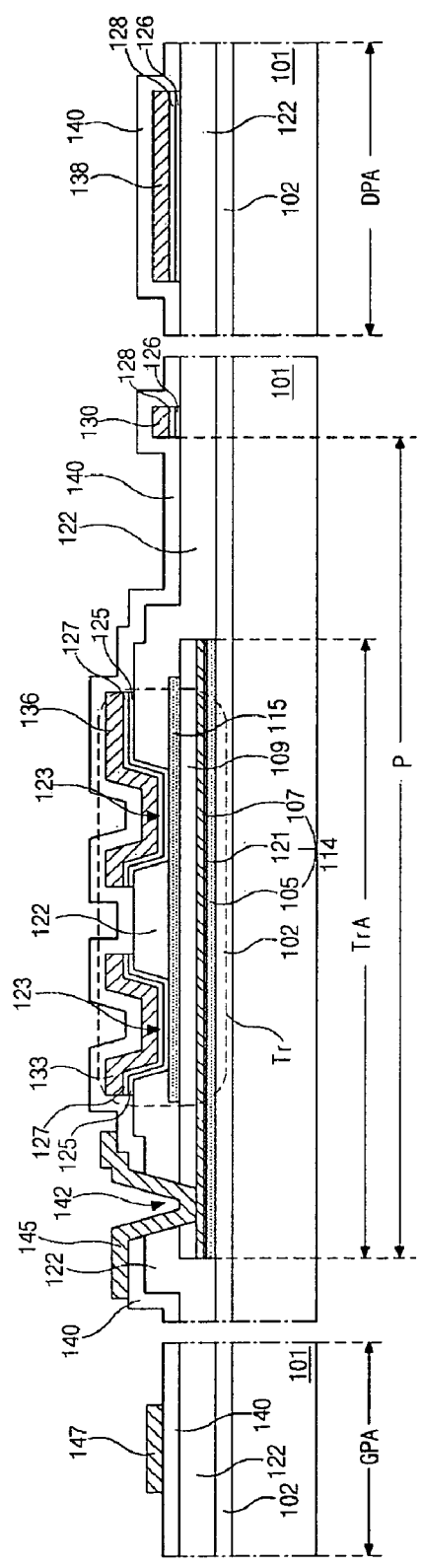

Next, as shown in FIG. 4K, a third metal layer (not shown) is formed on the first passivation layer 140 including the gate contact hole 142 by depositing a third metallic material, for example, aluminum (Al), Al alloy, copper (Cu), Cu alloy, molybdenum (Mo) or chromium (Cr). The third metal layer is patterned by a mask process to form a gate line 145 contacting the gate electrode 114 through the gate contact hole 142 and crossing the data line 130 to define the pixel region P. Since the gate line 145 contacts the top pattern 107, which is formed of the first metallic material, of the gate electrode 114, a contact resistance between the gate line 145 and the gate electrode 114 is reduced with compared to contacting the bottom pattern 105 of impurity-doped polycrystalline silicon. Namely, if the gate electrode 114 is formed of a single layer of impurity-doped polycrystalline silicon, a contact resistance between the gate electrode 114 of impurity-doped polycrystalline silicon and the gate line 145 of the third metallic material is relatively high. However, since the gate electrode 114 in the present invention is formed of a triple layer including the bottom pattern 105 of impurity-doped polycrystalline silicon, the middle pattern 121 of silicide and the top pattern 107 of the first metallic material, the contact resistance between the gate line 145 and the top pattern 107 of the gate electrode 114 is reduced. At the same time, a gate pad electrode 147 connecting an end of the gate line 145 is formed on the first passivation layer 140 and in the gate pad region GPA.

On the other hand, each of the gate line 145 and the gate pad 147 may have a double-layered structure or a triple-layered structure. For example, the double-layered structure may include an Mo alloy layer and an Al layer, while the triple-layered structure may include an Mo layer, an Al alloy layer and an Mo layer. FIG. 4K shows each of the gate line 145 and the gate pad 147 has a single-layered structure.

Figure 4L:
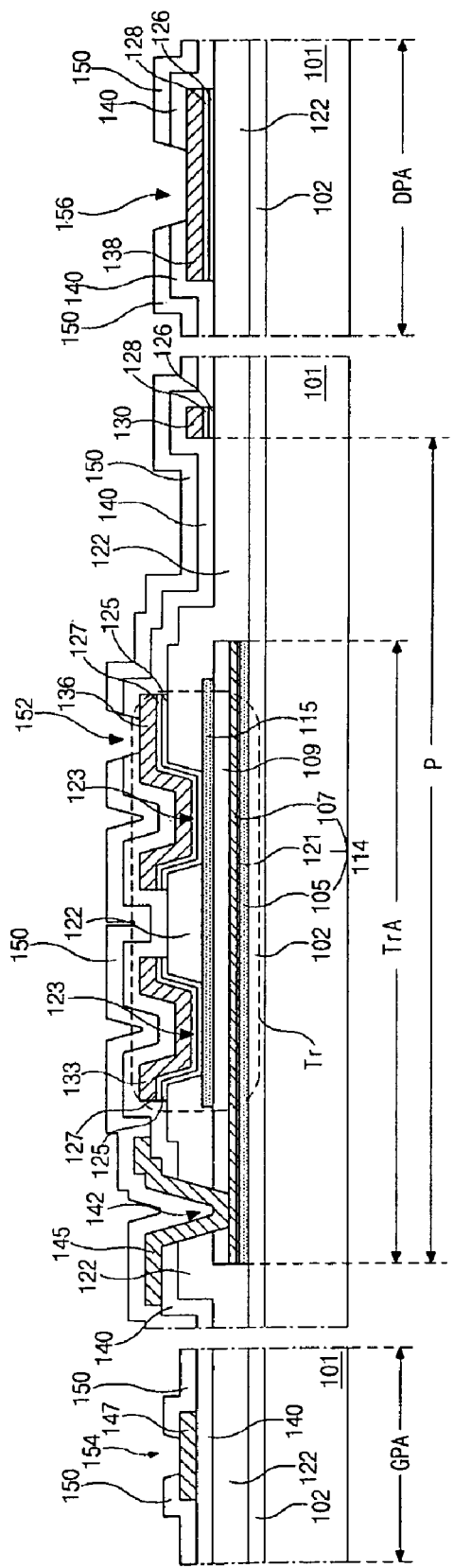

Next, as shown in FIG. 4L, a second passivation layer 150 is formed on the gate line 145 and the gate pad electrode 147 by depositing an inorganic insulating material, for example, silicon oxide or silicon nitride. The second passivation layer 150 and the first passivation layer 140 under the second passivation layer 150 are etched to form a drain contact hole 152 exposing the drain electrode 136 and a data pad contact hole 156 exposing the data pad electrode 138. At the same time, the second passivation layer 150 in the gate pad region GPA is etched to form a gate pad contact hole 154 exposing the gate pad electrode 147.

Next, as shown in FIG. 4M, a transparent conductive material layer (not shown) is formed on the second passivation layer 150 including the drain contact hole 152, the gate pad contact hole 154 and the data pad contact hole 156 by depositing a transparent conductive material, for example, indium-tin-oxide (ITO) or indium-zinc-oxide (IZO). The transparent conductive material layer is patterned by a mask process to form a pixel electrode 170 contacting the drain electrode 136 through the drain contact hole 152 and positioned in each pixel region P. At the same time, an auxiliary gate pad electrode 172 contacting the gate pad electrode 157 through the gate pad contact hole 154 and an auxiliary data pad electrode 174 contacting the data pad electrode 138 through the data pad contact hole 156 are formed.

On the other hand, when the driving TFT is formed to use the array substrate for the OELD device, the pixel electrode 170 does not contact the drain electrode 136 of the TFT Tr as the switching TFT. The pixel electrode contacts a drain electrode of the driving TFT through a contact hole exposing the drain electrode of the driving TFT, and the first and second passivation layers 140 and 150 does not expose the drain electrode 136 of the TFT Tr.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, comprising:
    forming a buffer layer of inorganic insulating material on a substrate including a pixel region;
    forming a gate electrode on the buffer layer, a gate insulating layer on the gate electrode and an active layer on the gate insulating layer, the gate electrode including a bottom pattern of impurity-doped polycrystalline silicon, a middle pattern of silicide and a top pattern of a first metallic material and positioned in a switching region in the pixel region;
    forming an interlayer insulating layer on the active layer and including first and second contact holes, the first and second contact holes respectively exposing both sides of the active layer;
    forming first and second barrier patterns respectively contacting the both sides of the active layers through the first and second contact holes, first and second ohmic contact patterns respectively on the first and second barrier patterns, a source electrode on the first ohmic contact pattern, a drain electrode on the second ohmic contact pattern, and a data line connecting the source electrode;
    forming a first passivation layer on the source electrode, the drain electrode and the data line and including a gate contact hole exposing the gate electrode;
    forming a gate line on the first passivation layer and contacting the gate electrode through the gate contact hole, the gate line crossing the data line to define the pixel region;
    forming a second passivation layer on the gate line and including a drain contact hole exposing the drain electrode; and
    forming a pixel electrode on the second passivation layer and contacting the drain electrode through the drain contact hole.

2. The method according to claim 1, wherein the step of forming the gate electrode, the gate insulating layer and the active layer includes:
    sequentially forming a first impurity-doped amorphous silicon layer, a first metal layer, a first inorganic insulating layer and an intrinsic amorphous silicon layer;
    performing a solid phase crystallization process to crystallize the intrinsic amorphous silicon layer into an intrinsic polycrystalline silicon layer and the impurity-doped amorphous silicon layer into an impurity-doped polycrystalline silicon layer and form a silicide layer between the impurity-doped polycrystalline silicon layer and the first metal layer;
    forming first, second and third photoresist (PR) patterns on the intrinsic polycrystalline silicon layer and in the switching region, the first and second PR patterns each having a first thickness, a third PR pattern having a second thickness larger than the first thickness, wherein the first PR pattern is positioned at one end of the third PR pattern, and the second PR pattern is positioned at the other end of the third PR pattern;
    etching the polycrystalline silicon layer exposed by the first, second and third PR patterns, and the first inorganic insulating layer, the first metal layer, the silicide layer and the impurity-doped polycrystalline silicon layer under the exposed polycrystalline silicon layer to form the gate electrode, the gate insulating layer and an intrinsic polycrystalline silicon pattern on the gate insulating layer;
    ashing the first, second and third PR patterns to expose sides of the intrinsic polycrystalline silicon pattern by removing the first and second PR pattern and form a fourth PR pattern from the third PR pattern;
    etching the exposed sides of the intrinsic polycrystalline silicon pattern to form the active layer; and
    removing the fourth PR pattern.

3. The method according to claim 2, wherein the first metal layer includes one of molybdenum and titanium and has a thickness of about 100 to 500 angstroms.

4. The method according to claim 2, wherein the solid phase crystallization process is one of a thermal crystallization process or an alternating magnetic field crystallization process.

5. The method according to claim 2, wherein the solid phase crystallization process is performed under a temperature of about 600 to 800° C.

6. The method according to claim 2, wherein the step of forming the first and second barrier patterns, the first and second ohmic contact patterns, the source and drain electrodes and the data line includes:
- sequentially forming a barrier material layer of intrinsic amorphous silicon, a second impurity-doped amorphous silicon layer and a second metal layer on the interlayer insulating layer; and
- sequentially patterning the barrier material layer, the second impurity-doped amorphous silicon layer and the second metal layer to form the first and second barrier patterns, the first and second ohmic contact patterns, the source and drain electrodes and the data line.

7. The method according to claim 6, further comprising performing a cleaning process onto the exposed sides of the active layer using a buffered oxide etchant before the step of forming the barrier material layer.

8. The method according to claim 6, wherein the first barrier pattern, the first ohmic contact layer and the source electrode have substantially the same plane area and the same plane shape as one another, and the second barrier pattern, the second ohmic contact layer and the drain electrode have substantially the same plane area and the same plane shape as one another.

9. The method according to claim 1, wherein the step of forming the data line further includes forming a data pad electrode at one end of the data line, and the step of forming the gate line further includes forming a gate pad electrode at one end of the gate line, and wherein the step of forming the pixel electrode further includes forming an auxiliary gate pad electrode contacting the gate pad electrode and an auxiliary data pad electrode contacting the data pad electrode.

10. The method according to claim 1, wherein a thickness of the interlayer insulating layer is equal to or larger than a thickness summation of the gate electrode and the gate insulating layer.

11. The method according to claim 1, wherein the bottom pattern of the gate electrode has a thickness of about 500 to 1000 angstroms, and the active layer has an uniform thickness of about 300 to 1000 angstroms.

12. The method according to claim 1, wherein the active layer leans to one side with respect to a center of the gate electrode, and the gate contact hole exposes the other side of the gate electrode.

13. An array substrate, comprising:
- a buffer layer of an inorganic insulating layer on a substrate including a pixel region;
- a gate electrode on the buffer layer and in a switching region in the pixel region, the gate electrode including a bottom pattern of impurity-doped polycrystalline silicon, a middle pattern of silicide and a top pattern of a metallic material;
- a gate insulating layer on the gate electrode;
- an active layer on the gate insulating layer and exposing sides of the gate insulating layer, the active layer formed of intrinsic polycrystalline silicon;
- an interlayer insulating layer on the active layer and including first and second contact holes, the first and second contact holes respectively exposing both sides of the active layer;
- first and second barrier patterns respectively contacting the both sides of the active layers through the first and second contact holes;
- first and second ohmic contact patterns respectively on the first and second barrier patterns;
- a source electrode on the first ohmic contact pattern;
- a drain electrode on the second ohmic contact pattern;
- a data line connecting the source electrode on the interlayer insulating layer;
- a first passivation layer on the source electrode, the drain electrode and the data line and including a gate contact hole exposing the gate electrode;
- a gate line on the first passivation layer and contacting the gate electrode through the gate contact hole, the gate line crossing the data line to define the pixel region;
- a second passivation layer on the gate line and including a drain contact hole exposing the drain electrode; and
- a pixel electrode on the second passivation layer and contacting the drain electrode through the drain contact hole.

14. The substrate according to claim 13, wherein the bottom pattern has a thickness of about 500 to 1000 angstroms, and the active layer has a thickness of about 300 to 1000 angstroms, and wherein the barrier pattern has a thickness of about 50 to 300 angstroms.

15. The array substrate according to claim 13, further comprising:
- a data pad electrode at one end of the data line;
- a gate pad electrode at one end of the gate line;
- an auxiliary data pad electrode on the second passivation layer and contacts the data pad electrode; and
- an auxiliary gate pad electrode on the second passivation layer and contacts the gate pad electrode.

16. The substrate according to claim 13, wherein the active layer leans to one side with respect to a center of the gate electrode, and the gate contact hole exposes the other side of the gate electrode.

17. The substrate according to claim 13, wherein a thickness of the interlayer insulating layer is equal to or larger than a thickness summation of the gate electrode and the gate insulating layer.

* * * * *